US009391200B2

(12) United States Patent
Liu et al.

(10) Patent No.: US 9,391,200 B2
(45) Date of Patent: Jul. 12, 2016

(54) FINFETS HAVING STRAINED CHANNELS, AND METHODS OF FABRICATING FINFETS HAVING STRAINED CHANNELS

(71) Applicants: STMicroelectronics, Inc., Coppell, TX (US); International Business Machines Corporation, Armonk, NY (US); GLOBALFOUNDRIES Inc., Grand Cayman (KY)

(72) Inventors: Qing Liu, Watervliet, NY (US); Xiuyu Cai, Niskayuna, NY (US); Ruilong Xie, Schenectady, NY (US); Chun-chen Yeh, Clifton Park, NY (US)

(73) Assignees: STMicroelectronics, Inc., Coppell, TX (US); International Business Machines Corporation, Armonk, NY (US); GLOBALFOUNDRIES Inc., Grand Cayman (KY)

( * ) Notice: Subject to any disclaimer, the term of this patent is extended or adjusted under 35 U.S.C. 154(b) by 16 days.

(21) Appl. No.: 14/308,045

(22) Filed: Jun. 18, 2014

(65) Prior Publication Data

US 2015/0372140 A1    Dec. 24, 2015

(51) Int. Cl.
*H01L 21/02*  (2006.01)
*H01L 29/78*  (2006.01)
*H01L 29/66*  (2006.01)
*H01L 21/306* (2006.01)
*H01L 21/311* (2006.01)

(52) U.S. Cl.
CPC ...... *H01L 29/7848* (2013.01); *H01L 21/30625* (2013.01); *H01L 21/311* (2013.01); *H01L 29/66818* (2013.01); *H01L 29/785* (2013.01)

(58) Field of Classification Search
CPC ............ H01L 29/66795; H01L 29/785; H01L 29/66545; H01L 29/7851; H01L 29/6653; H01L 29/6656; H01L 29/41791; H01L 29/6681; H01L 29/66636; H01L 21/823431; H01L 21/823821; H01L 21/76224; H01L 21/30604; H01L 21/845; H01L 27/0886; H01L 27/0924; H01L 27/1211; H01L 21/30625; H01L 21/311; H01L 29/66818; H01L 29/7848

See application file for complete search history.

(56) References Cited

U.S. PATENT DOCUMENTS

| | | | | |
|---|---|---|---|---|
| 5,792,705 A | * | 8/1998 | Wang | H01L 21/31053 257/E21.244 |
| 8,183,627 B2 | * | 5/2012 | Currie | H01L 21/823807 257/329 |
| 8,455,313 B1 | * | 6/2013 | Basker | H01L 29/66795 257/E21.06 |
| 9,018,713 B2 | * | 4/2015 | Erickson | H01L 21/823431 257/401 |
| 9,123,744 B1 | * | 9/2015 | Liao | H01L 21/0262 |
| 2003/0076459 A1 | * | 4/2003 | Murade | G02F 1/133512 349/111 |
| 2005/0093084 A1 | * | 5/2005 | Wang | H01L 21/28194 257/410 |
| 2009/0095980 A1 | * | 4/2009 | Yu | H01L 29/66795 257/190 |
| 2011/0147828 A1 | * | 6/2011 | Murthy | H01L 21/02057 257/327 |
| 2011/0316080 A1 | * | 12/2011 | Luo | H01L 29/7851 257/347 |
| 2012/0146148 A1 | * | 6/2012 | Iwamatsu | H01L 27/1207 257/351 |
| 2012/0280250 A1 | * | 11/2012 | Basker | H01L 21/823821 257/77 |

(Continued)

*Primary Examiner* — Brett Feeney
*Assistant Examiner* — Sophia Nguyen
(74) *Attorney, Agent, or Firm* — Gardere Wynne Sewell LLP

(57) ABSTRACT

Techniques and structures for controlling etch-back of a fin-FET fin are described. One or more layers may be deposited over the fin and etched. Etch-back of a planarization layer may be used to determine a self-limited etch height of one or more layers adjacent the fin and a self-limited etch height of the fin. Strain-inducing material may be formed at regions of the etched fin to induce strain in the channel of a finFET.

21 Claims, 11 Drawing Sheets

(56) References Cited

U.S. PATENT DOCUMENTS

| | | | | |
|---|---|---|---|---|
| 2013/0161756 A1* | 6/2013 | Glass | H01L 29/66545 | 257/369 |
| 2013/0187228 A1* | 7/2013 | Xie | H01L 29/785 | 257/347 |
| 2013/0249019 A1* | 9/2013 | Kelly | H01L 29/7845 | 257/402 |
| 2013/0292805 A1* | 11/2013 | Cai | H01L 29/66795 | 257/622 |
| 2014/0117507 A1* | 5/2014 | Juengling | H01L 27/092 | 257/622 |
| 2014/0183599 A1* | 7/2014 | Hong | H01L 29/785 | 257/190 |
| 2014/0191318 A1* | 7/2014 | Lin | H01L 21/823821 | 257/344 |
| 2014/0252427 A1* | 9/2014 | Cheng | H01L 29/4232 | 257/288 |
| 2014/0264604 A1* | 9/2014 | Tsai | H01L 29/785 | 257/347 |
| 2014/0264607 A1* | 9/2014 | Basu | H01L 29/785 | 257/365 |
| 2014/0299934 A1* | 10/2014 | Kim | H01L 29/7848 | 257/347 |
| 2014/0315371 A1* | 10/2014 | Cai | H01L 21/823821 | 438/424 |
| 2015/0061027 A1* | 3/2015 | Hong | H01L 27/092 | 257/369 |
| 2015/0091059 A1* | 4/2015 | Hung | H01L 29/66795 | 257/192 |
| 2015/0091100 A1* | 4/2015 | Xie | H01L 21/76224 | 257/401 |
| 2015/0108544 A1* | 4/2015 | Ching | H01L 21/823821 | 257/192 |
| 2015/0132908 A1* | 5/2015 | Jeong | H01L 29/66795 | 438/283 |
| 2015/0137263 A1* | 5/2015 | Lee | H01L 29/66795 | 257/401 |
| 2015/0200271 A1* | 7/2015 | Lee | H01L 29/66545 | 257/401 |
| 2015/0214331 A1* | 7/2015 | Jang | H01L 29/66545 | 438/164 |
| 2015/0228653 A1* | 8/2015 | Cheng | H01L 27/0924 | 257/369 |
| 2015/0236015 A1* | 8/2015 | Jeong | H01L 27/0886 | 257/401 |
| 2015/0243745 A1* | 8/2015 | Kelly | H01L 29/41766 | 257/369 |
| 2015/0255542 A1* | 9/2015 | Cai | H01L 29/66545 | 257/401 |
| 2015/0263045 A1* | 9/2015 | Leobandung | H01L 21/823431 | 257/351 |
| 2015/0279993 A1* | 10/2015 | Zhu | H01L 21/823412 | 257/192 |
| 2015/0333172 A1* | 11/2015 | Cheng | H01L 29/785 | 257/192 |

* cited by examiner

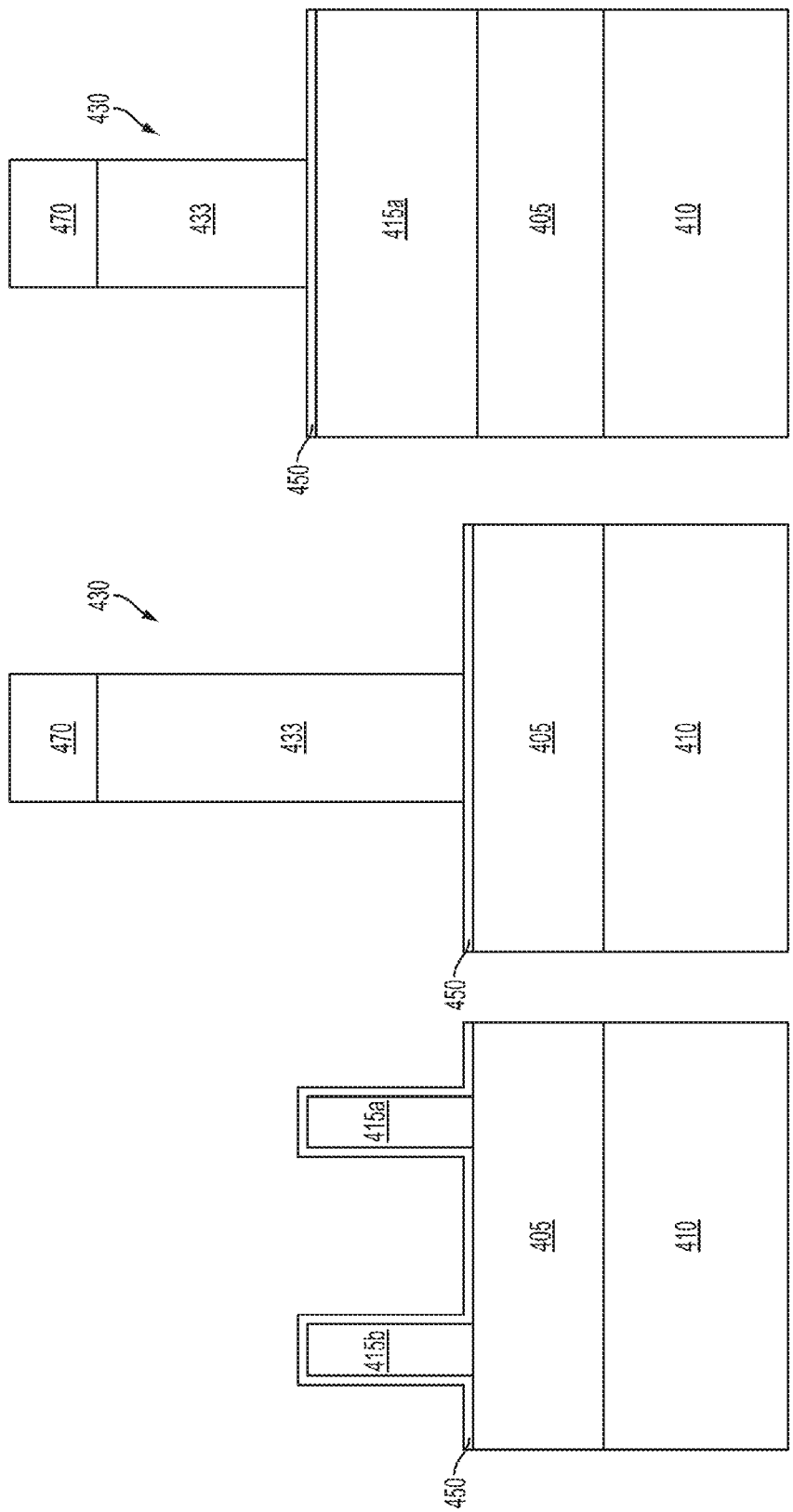

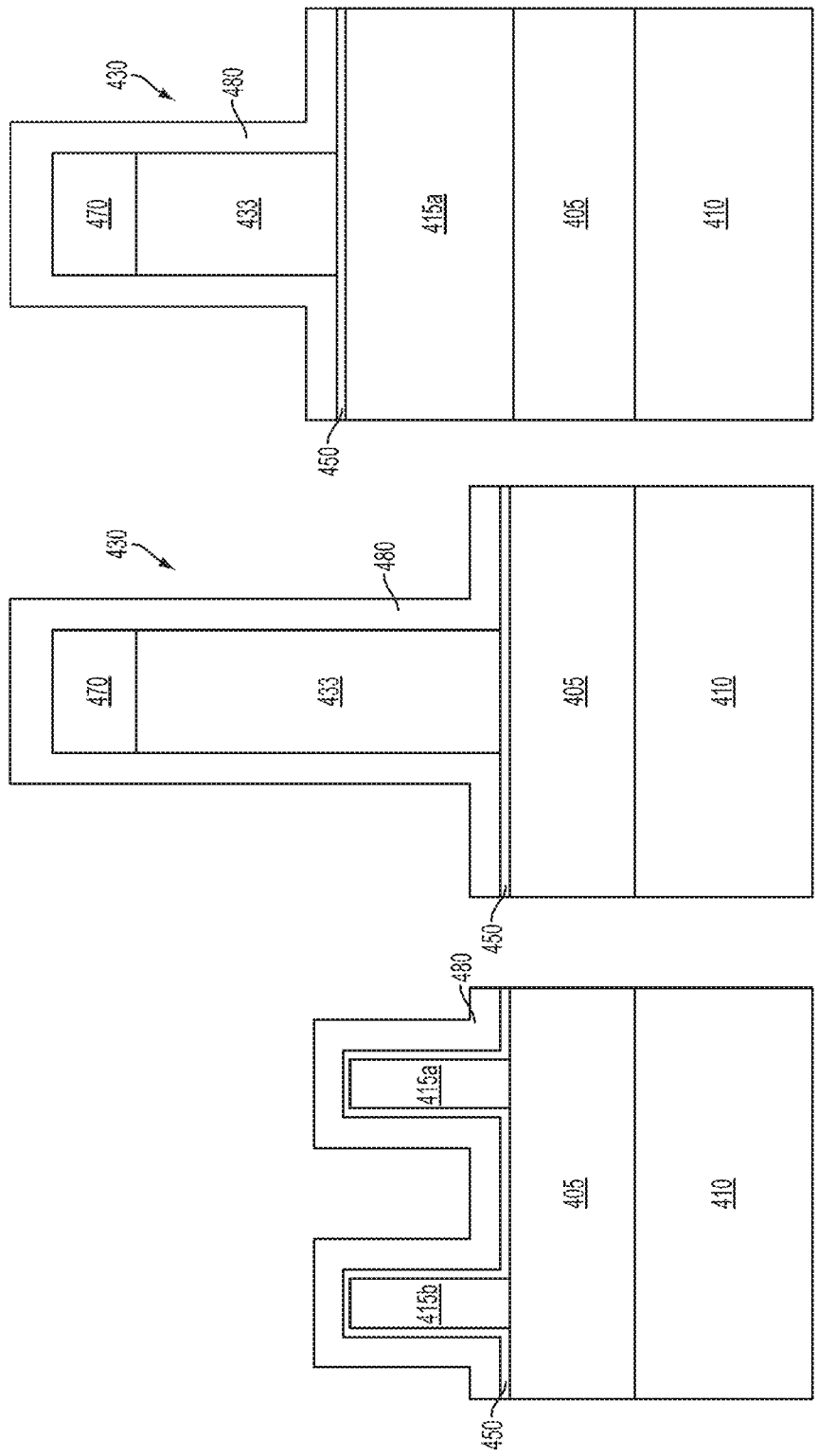

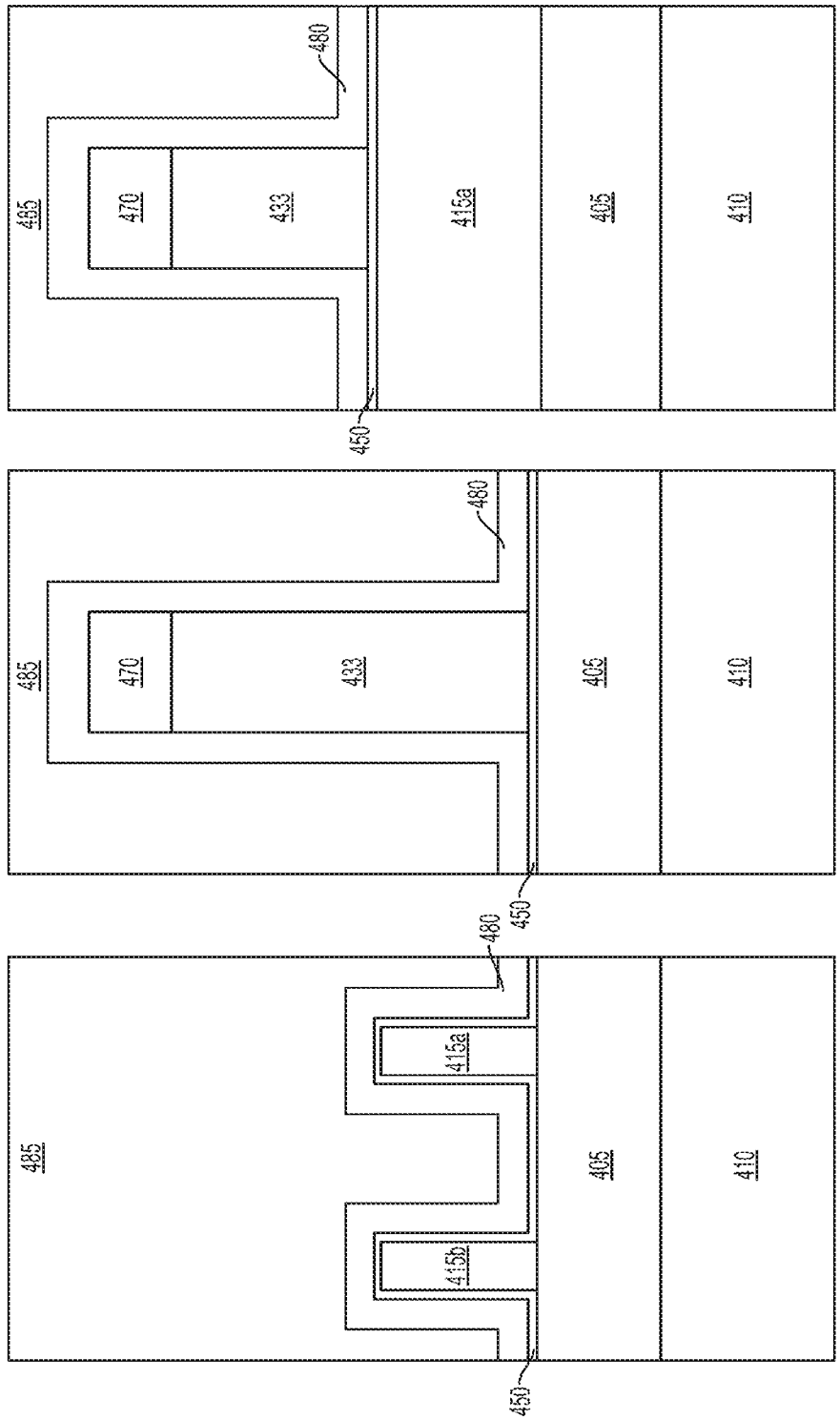

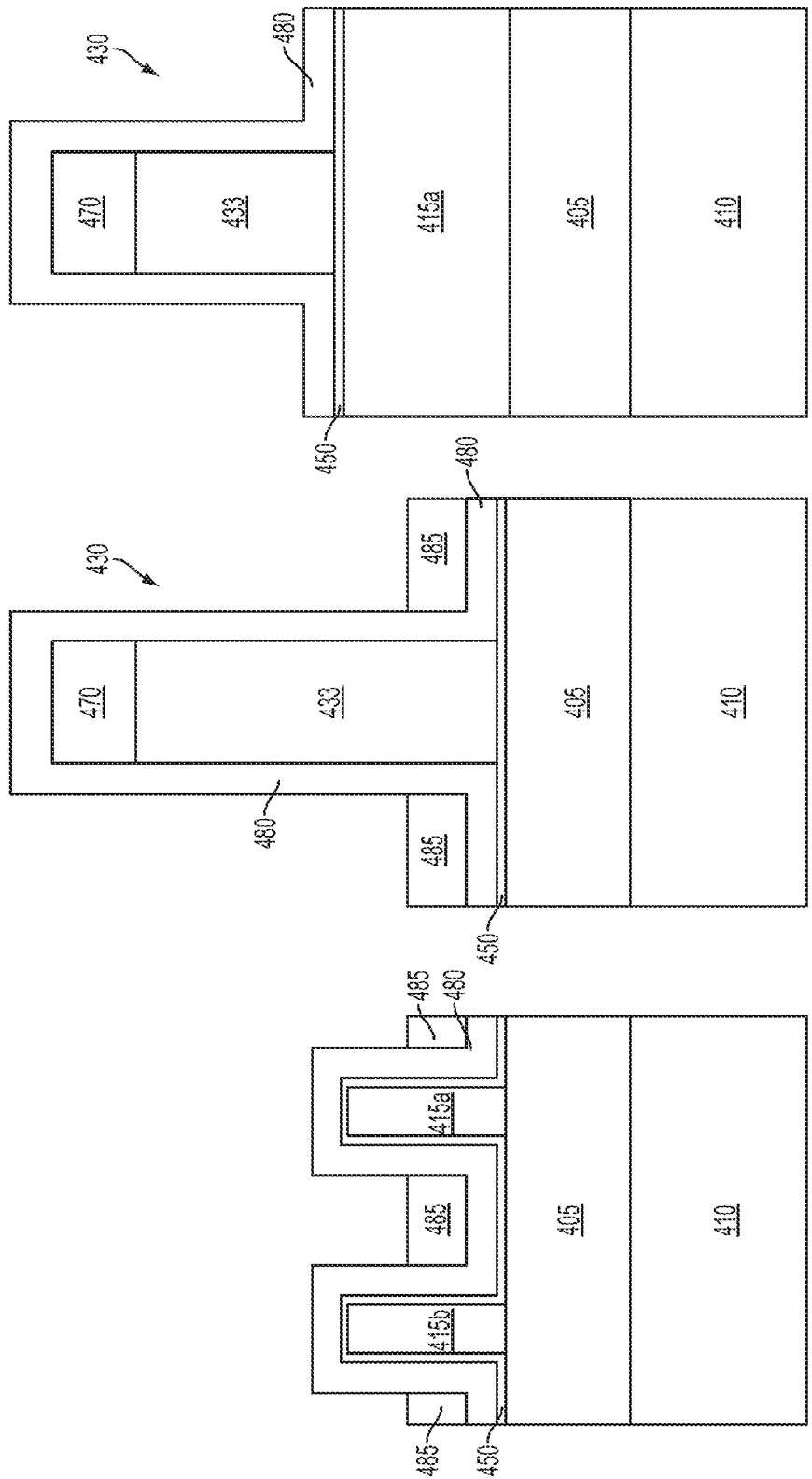

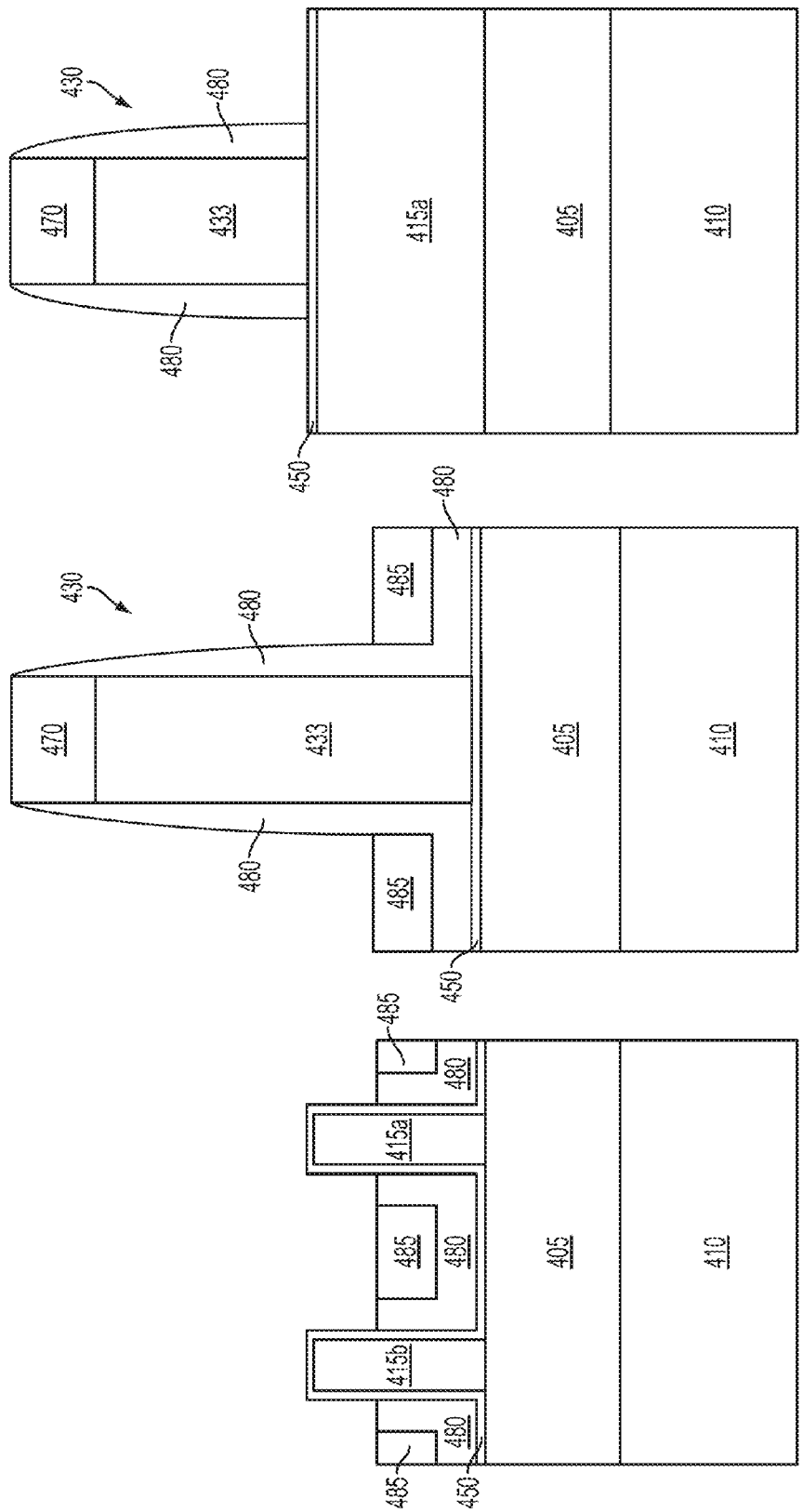

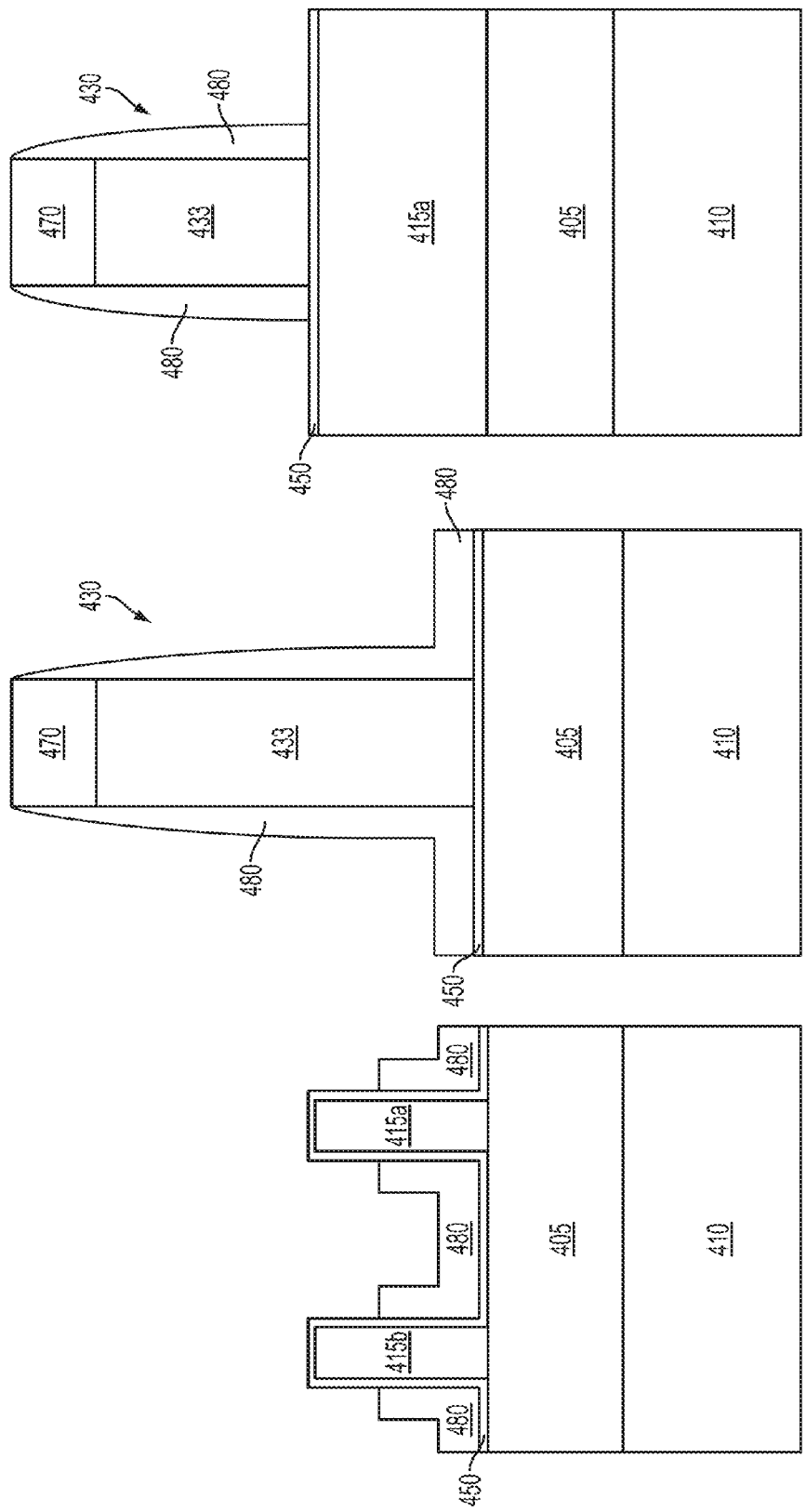

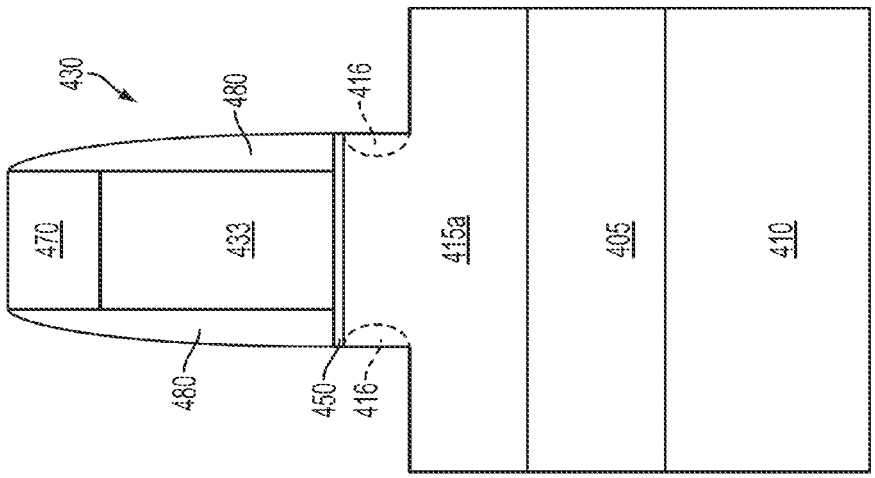
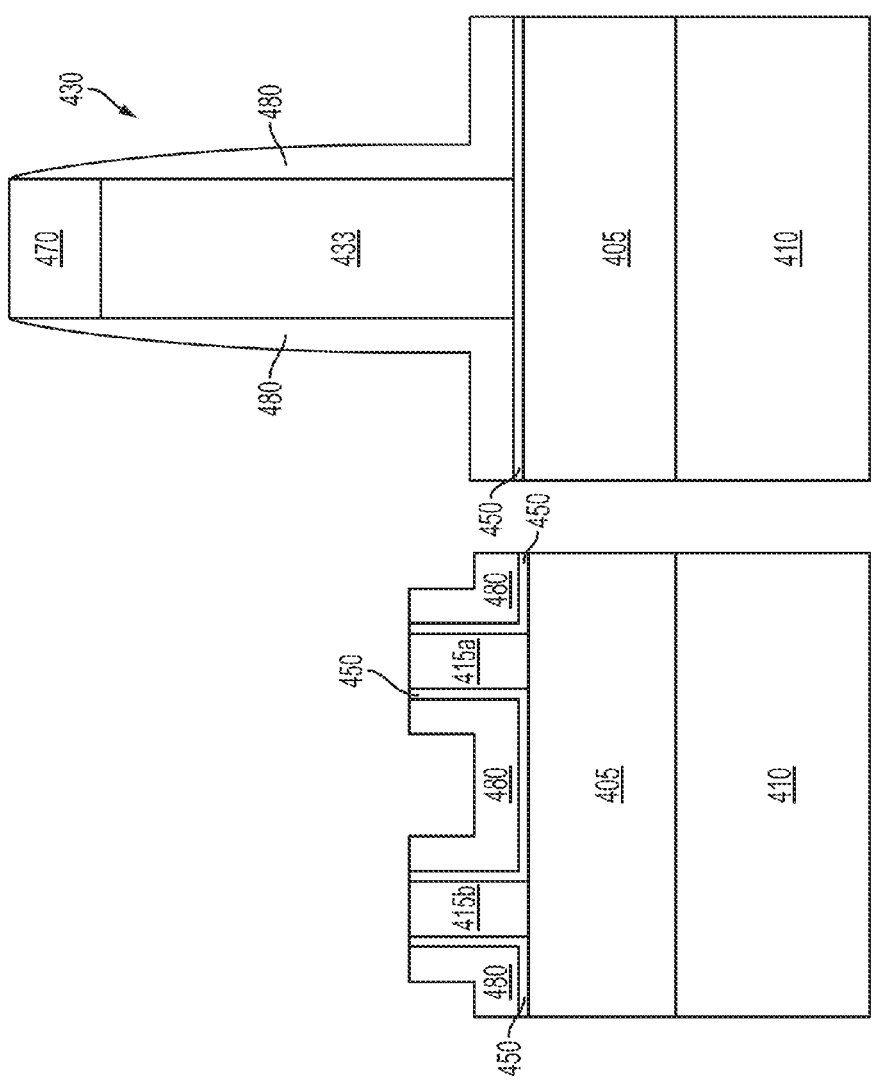
FIG. 11C
FIG. 11B
FIG. 11A

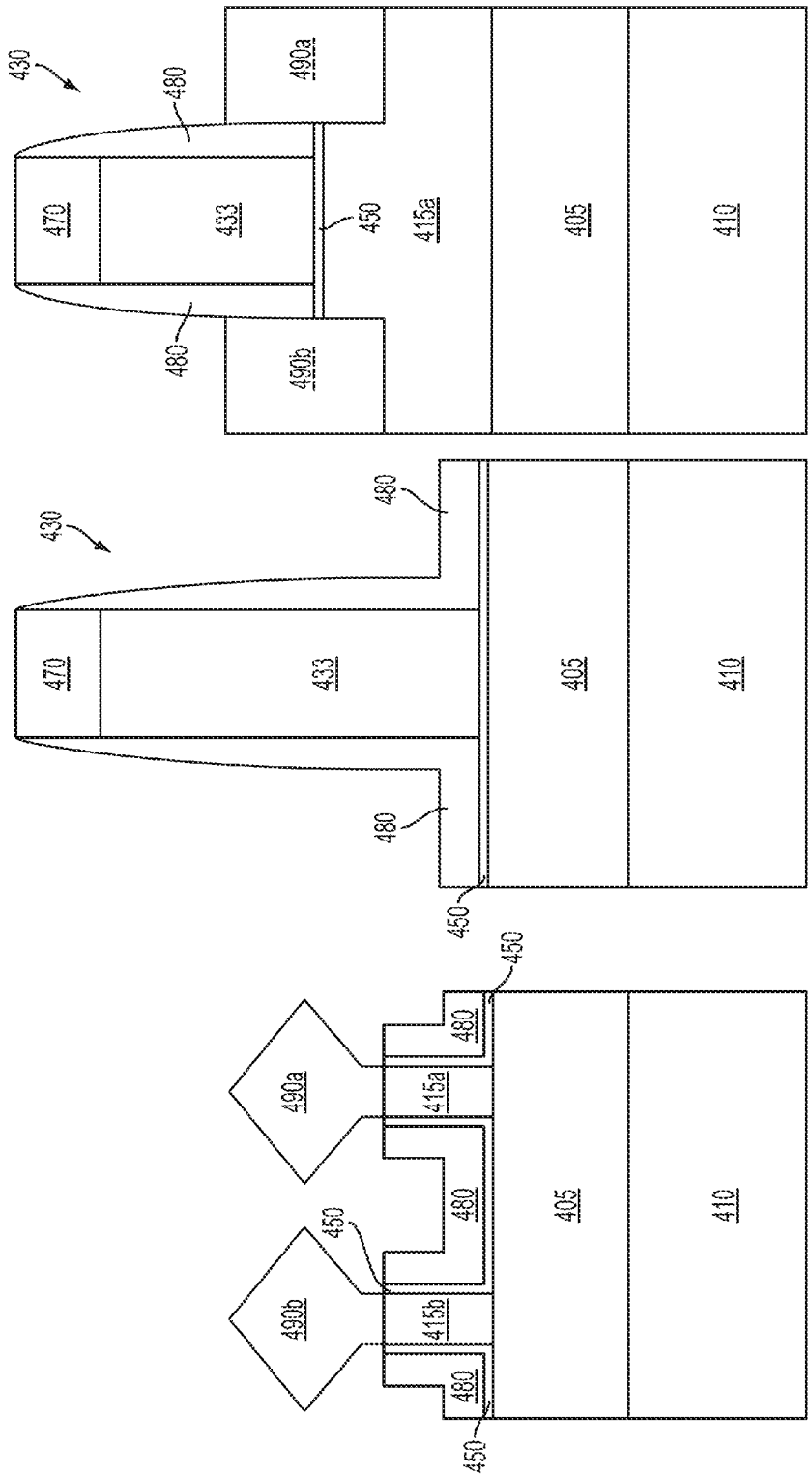

FINFETS HAVING STRAINED CHANNELS, AND METHODS OF FABRICATING FINFETS HAVING STRAINED CHANNELS

BACKGROUND

1. Technical Field

The present disclosure relates to methods of forming semiconductor devices having one or more fin structures ("fins"), and to semiconductor devices having one or more fins. Some embodiments described in the present disclosure relate to finFETs having strained channels and/or to methods for fabricating finFETs having strained channels.

2. Discussion of the Related Art

Transistors are fundamental device elements of many modern digital processors and memory devices, and have found numerous applications in various areas of electronics including data processing, data storage, and high-power applications. Currently, there are a variety of transistor types and designs that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and superjunction or multi-drain transistors.

Two types of transistors which have emerged within the MOSFET family of transistors show promise for scaling to ultra-high density and nanometer-scale channel lengths. One of these transistor types is a so-called fin field-effect transistor or "finFET." The channel of a finFET is formed in a three-dimensional fin that may extend from a surface of a substrate. FinFETs have favorable electrostatic properties for complimentary MOS (CMOS) scaling to smaller sizes. Because the fin is a three-dimensional structure, the transistor's channel can be formed on three or more surfaces of the fin, so that the finFET can exhibit a high current switching capability for a given surface area occupied on substrate. Since the channel and device can be raised from the substrate surface, there can be reduced electric field coupling between adjacent devices as compared to conventional planer MOSFETs.

The second type of transistor is called a fully-depleted, silicon-on-insulator or "FD-SOI" FET. The channel, source, and drain of an FD-SOI FET are formed in a thin planar semiconductor layer that overlies a thin insulator. Because the semiconductor layer and the underlying insulator are thin, the body of the transistor (which lies below the thin insulator) can act as a second gate. The thin layer of semiconductor on insulator permits higher body biasing voltages that can boost performance. The thin insulator also reduces leakage current to the transistor's body region relative to the leakage current that would otherwise occur in bulk FET devices.

FET performance may be improved by adjusting the strain in the FET's channel to increase carrier mobility within the channel. For silicon FETs, device performance may be improved by applying compressive strain to a p-channel device, and/or by applying tensile strain to an n-channel device. In some cases, channel strain may be induced by straining the FET's source and/or drain regions, such that the strain is transferred through the source and/or drain regions to the channel.

SUMMARY

According to some embodiments, a method for forming fins of a finFET is provided, the method comprising: forming one or more layers over a semiconductor fin; etching the one or more layers in a region adjacent the fin to expose at least a portion of the fin; and etching the fin to a height determined, at least in part, by at least one of the one or more layers.

In some embodiments, the etching of the fin is self-limited by at least a level of one of the one or more layers and by a width of an opening defined by the fin.

In some embodiments, the width of the fin is between approximately 3 nm and approximately 10 nm.

In some embodiments, etching the fin comprises etching the fin to approximately an adjacent surface of at least one of the one or more layers.

In some embodiments, the one or more layers comprise a first layer covering the fin and a second layer covering the fin and the first layer.

In some embodiments, etching the one or more layers comprises removing a portion of the second layer to expose the first layer in the region adjacent the fin.

In some embodiments, removing the portion of the second layer comprises: planarizing the second layer; and performing a timed etch of the second layer to etch back a surface of the second layer to a level below the top of the fin.

In some embodiments, the method further comprises forming the first layer as a spacer layer at the fin and at a gate conductor for the fin, wherein etching the one or more layers in the region adjacent the fin comprises etching the first layer to a height determined, at least in part, by a level of the second layer adjacent the fin.

In some embodiments, etching the first layer comprises etching the first layer to approximately a surface of the second layer.

In some embodiments, the etching of the first layer in the region adjacent the fin is self-limited by at least a level of the second layer and a width of the first layer in the region adjacent the fin.

In some embodiments, the spacer layer comprises a nitride and etching the one or more layers further comprises etching the first layer at the gate conductor to form gate spacers.

In some embodiments, the method further comprises removing the second layer after etching the first layer in the region adjacent the fin and before etching the fin.

In some embodiments, etching the fin comprises etching the fin to approximately an edge of the first layer adjacent the fin.

In some embodiments, the etching of the fin is self-limited, at least in part, by a location of the edge of the first layer and by a width of an opening defined by the fin.

In some embodiments, etching the fin comprises etching the fin to approximately a surface of the second layer.

In some embodiments, the etching of the fin is self-limited by at least a height of the first layer adjacent the fin and by a width of an opening defined by the fin.

In some embodiments, forming the one or more layers comprises: conformally depositing the first layer over the fin to a thickness between approximately 5 nm and approximately 10 nm; and depositing the second layer to cover the fin and the first layer.

In some embodiments, the method further comprises forming a spacer layer for a gate structure of the finFET in a same deposition step in which the first layer is deposited over the fin.

In some embodiments, etching the fin comprises etching the fin at source and drain regions of the finFET, and the method further comprises growing strain-inducing material at the source and drain regions.

In some embodiments, a lattice parameter of the strain-inducing material differs from a lattice parameter of the fin.

In some embodiments, the strain-inducing material imparts a strain in a channel of the finFET.

In some embodiments, the fin is formed from bulk silicon and the strain-inducing material comprises silicon germanium and/or silicon carbide.

In some embodiments, the one or more layers further comprise a conformal insulating layer, wherein the method further comprises forming the conformal insulating layer on the fin prior to forming the first layer over the fin, and wherein etching the one or more layers comprises etching the conformal insulating layer.

In some embodiments, the insulating layer forms a gate insulator for the finFET.

In some embodiments, the second layer comprises an organic planarization layer.

According to some embodiments, a finFET is provided, comprising: a fin having recessed source and drain regions; a spacer layer formed adjacent the side walls of the recessed source and drain regions; and strain-inducing material formed at the source and drain regions, wherein a height of the fin at the recessed source and drain regions is approximately equal to a height of the spacer layer adjacent the side walls of the recessed source and drain regions.

In some embodiments, a width of the fin is between approximately 3 nm and approximately 10 nm.

In some embodiments, the strain-inducing material comprises epitaxially-grown material.

In some embodiments, the strain-inducing material is configured to impart strain to a channel region of the finFET.

In some embodiments, a lattice parameter of the strain-inducing material differs from a lattice parameter of the fin.

In some embodiments, the spacer layer comprises a conformal spacer layer, wherein the conformal spacer layer is also formed at a gate structure of the finFET.

In some embodiments, the finFET further comprises a conformal oxide layer disposed on the side surfaces of the fin, between the fin and the spacer layer.

In some embodiments, the spacer layer comprises one or more nitrides.

In some embodiments, the finFET further comprises a gate structure formed adjacent the fin, wherein a portion of the spacer layer is formed adjacent the gate and is configured as a gate spacer.

In some embodiments, the finFET is formed on a silicon-on-insulator (SOI) substrate.

In some embodiments, the finFET is formed on a buried oxide (BOX) layer of the SOI substrate.

In some embodiments, an integrated circuit comprises a plurality of the finFETs, wherein heights of the recessed source and drain regions of the fins are uniform across the integrated circuit to within ±2 nm.

According to some embodiments, a method for self-limited etching of a narrow, raised structure is provided, comprising: forming the narrow, raised structure to have a width less than approximately 10 nm; depositing material adjacent the narrow, raised structure; removing a portion of the material to reveal a portion of the narrow, raised structure; and etching the narrow, raised structure to a level approximately equal to a level of the material adjacent the narrow, raised structure.

In some embodiments, the narrow, raised structure comprises a fin for a finFET transistor.

In some embodiments, the narrow, raised structure further comprises a conformal insulating layer formed over the fin.

In some embodiments, depositing the material comprises forming a conformal layer of the material over the narrow, raised structure.

In some embodiments, depositing the material comprises forming a planarized layer of the material over the narrow, raised structure.

In some embodiments, removing a portion of the material comprises etching a surface of the planarized layer to a level below an upper surface of the narrow, raised structure.

BRIEF DESCRIPTION OF THE DRAWINGS

One of ordinary skill in the art will understand that the figures, described herein, are for illustration purposes only. It is to be understood that in some instances various aspects of the illustrated embodiments may be shown exaggerated or enlarged to facilitate an understanding of the embodiments. In the drawings, like reference characters generally refer to like features, functionally similar elements and/or structurally similar elements throughout the various figures. The drawings are not necessarily to scale, emphasis instead being placed upon illustrating the principles of the teachings. Where the drawings relate to fabrication of integrated devices, an illustrated device may be representative of a large plurality of devices that may be fabricated in parallel. The drawings are not intended to limit the scope of the present teachings in any way.

FIGS. 5A, 5B, and 5C show cross-sectional views of finFET 402 along A-A', B-B', and C-C', respectively, at the same stage of the fabrication process as illustrated in FIG. 4, according to some embodiments;

FIGS. 6A, 6B, and 6C show cross-sectional views of finFET 402 along A-A', B-B', and C-C', respectively, after another portion of a fabrication process, according to some embodiments;

FIGS. 7A, 7B, and 7C show cross-sectional views of finFET 402 along A-A', B-B', and C-C', respectively, after another portion of a fabrication process, according to some embodiments;

FIGS. 8A, 8B, and 8C show cross-sectional views of finFET 402 along A-A', B-B', and C-C', respectively, after another portion of a fabrication process, according to some embodiments;

FIGS. 9A, 9B, and 9C show cross-sectional views of finFET 402 along A-A', B-B', and C-C', respectively, after another portion of a fabrication process, according to some embodiments;

FIGS. 10A, 10B, and 10C show cross-sectional views of finFET 402 along A-A', B-B', and C-C', respectively, after another portion of a fabrication process, according to some embodiments;

FIGS. 11A, 11B, and 11C show cross-sectional views of finFET 402 along A-A', B-B', and C-C', respectively, after another portion of a fabrication process, according to some embodiments; and FIGS. 12A, 12B, and 12C show cross-sectional views of finFET 402 along A-A', B-B', and C-C', respectively, after another portion of a fabrication process, according to some embodiments.

DETAILED DESCRIPTION

Figure 1:
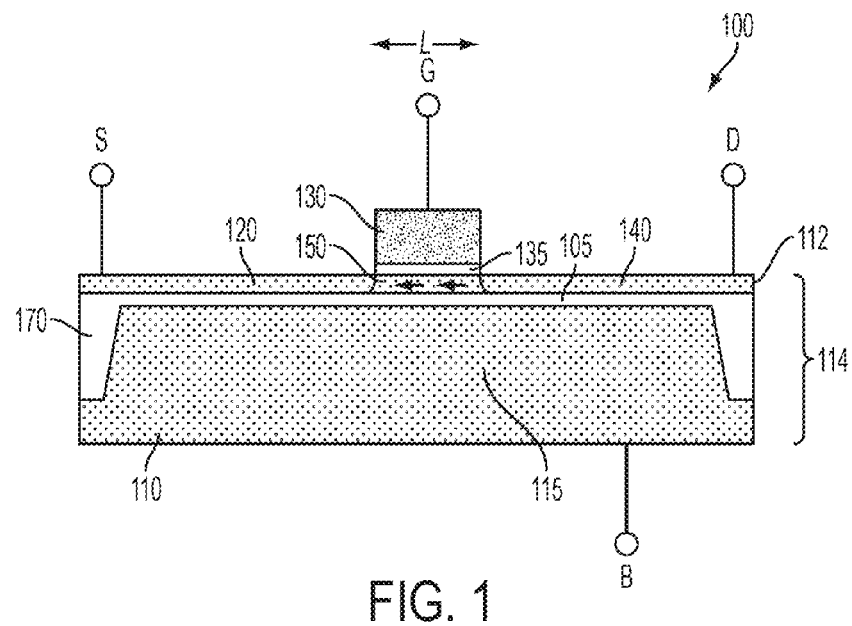
FIG. 1 shows an elevation view of an FD-SOI FET.

An example of a fully-depleted silicon-on-insulator (FD-SOI) FET 100 is depicted in FIG. 1, according to some embodiments. The FD-SOI FET may comprise a source region 120, a gate structure 130, 135, a drain region 140, and a channel region 150. The source, channel, and drain regions may be formed in a thin semiconductor layer 112 that is formed adjacent an insulating layer 105 (e.g., a thin insulating layer or buried oxide layer). The insulating layer 105 may be formed adjacent a substrate layer 110. In some embodiments, the substrate layer 110, insulating layer 105, and thin semiconductor layer 112 may collectively form a silicon-on-insulator (SOI) substrate 114. In some implementations, the semiconductor layer 112 and insulating layer 105 are ultrathin, e.g., less than about 35 nm or less than about 20 nm. Such devices may be referred to as ultra-thin body and buried oxide (UTBB) devices. In a UTBB structure, the insulating layer 105 may be less than about 30 nm in thickness, with a preferred thickness of about 25 nm for some embodiments, and the semiconductor layer 112 may be less than about 10 nm, with a preferred thickness of about 7 nm for some embodiments, for example. In some embodiments, trench isolation structures 170 comprising electrically-insulating material may be formed around one or more FD-SOI FETs. The gate structure may comprise a gate conductor 130 and a thin gate insulator 135. According to some embodiments, integrated source S, gate G, drain D, and body B interconnects may be formed to provide electrical connections to the source, gate, drain, and back body regions of the FD-SOI FET.

In some embodiments, the source region 120 and drain region 140 of an FD-SOI FET may be doped with acceptor or donor impurities to form regions of a first conductivity type (e.g., p-type or n-type). The channel region 150 may be doped to be of an opposite conductivity type, and may be of a same conductivity type as a back body region 115 (e.g., partially-depleted SOI or PD-SOI). In some implementations, the channel region 150 may be undoped (FD-SOI). An FD-SOI FET can exhibit reduced leakage currents compared to bulk FET devices and offer flexible bias strategies for improving speed or reducing threshold voltages for low-voltage applications.

Figure 2:
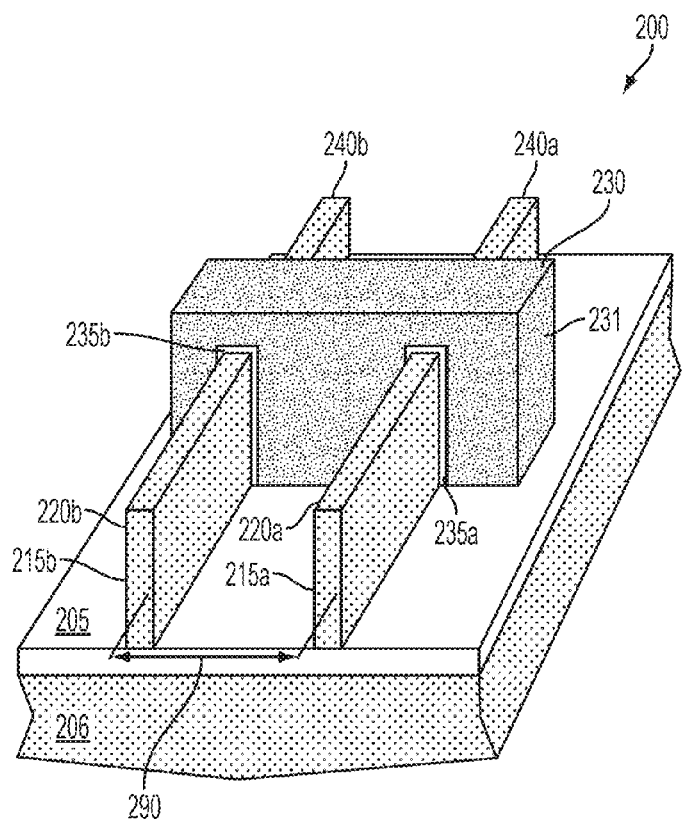
FIG. 2 shows a perspective view of a finFET, according to some embodiments.

An example of a finFET 200 is depicted in the perspective view of FIG. 2, according to some embodiments. In some embodiments, a finFET may be fabricated on a bulk semiconductor substrate 206, e.g., a bulk silicon substrate, and comprise one or more fin-like structures (215a, 215b) that run in a length direction along a surface of the substrate and extend in a height direction normal to the substrate surface. The fins 215 may have narrow widths, e.g., less than 50 nanometers. There may be an electrically-insulating layer 205, e.g., an oxide layer, on a surface of the substrate 206. The fins 215 may pass through the insulating layer 205, but be attached to the semiconducting substrate 206 at a lower region (e.g., "base") of the fin. A gate structure 230 comprising a conductive gate material 231 (e.g., polysilicon) and a gate insulator (235a, 235b) (e.g., an oxide and/or a high dielectric constant material) may be formed over a region of the fin. The finFET may further include a source region (220a, 220b) and drain region (240a, 240b) adjacent to the gate. A finFET may also include integrated source S, gate G, drain D, and body B interconnects (not shown) to provide electrical connections to the source, gate, drain, and back body regions of the device.

In some embodiments, during operation of the finFET, the entire fin portion encased by the gate structure may be inverted and form a bulk channel rather than a surface channel. In some embodiments, a metallic film may be deposited between a gate electrode 231 and gate oxide 235 (e.g., to improve gate conductance and/or gate switching speeds).

FinFETs like the finFET depicted in FIG. 2 may exhibit favorable electrostatic properties for scaling to high-density, low-power, integrated circuits. Because the fin and channel are raised from the substrate, cross-coupling between proximal devices may be reduced relative to cross-coupling between conventional FETs. For the device shown in FIG. 2, the fins 215 may be formed from the bulk substrate 206 by an etching process, and therefore may be attached to the substrate 206 at base regions of the fins, regions which are occluded in the drawing by the adjacent insulator 205. The insulator 205 may be formed after the etching of the fins 215. Because the fins 215 are attached to the semiconductor substrate, leakage current and cross-coupling may occur via the base region of the fin.

Alternatively, in some embodiments finFETs may be formed on an SOI substrate. When a finFET is formed on an SOI substrate, the fins may be attached to the thin semiconductor layer of the SOI substrate at base regions of the fins, or the fins may be formed by etching through the insulating layer of the SOI substrate such that the base regions of the fins are attached to the substrate layer of the SOI substrate.

Source, channel, and drain regions of a finFET may be doped with donor or acceptor impurities to create different regions of different conductivity types. Several different configurations of source, channel, and drain regions are possible. According to some embodiments, source region 220 and drain region 240 may be doped to be of a first conductivity type and the channel region 250 may be doped to be of an opposite conductivity type (or may be undoped). The terms "source region" and "drain region" as used may include extension regions of the fins that lie between source and drain contact regions and the channel region of the finFET device.

The finFET may further include a body region that may be of a same conductivity type as the channel region, or undoped (e.g., like the channel region). The doping of source and drain regions in a finFET may be of various geometries. In some embodiments, vertical portions of the fin 215 may be doped to form source 220 and drain 240 regions. Alternatively, according to some embodiments, outer sheath portions of a fin 215 may be doped to form source and drain regions.

As has been consistent since the early days of semiconductor device manufacturing, minimum feature sizes of semiconductor devices continue to shrink with successive generations of devices, or manufacturing "nodes," allowing a corresponding increase in the density of devices on an integrated circuit. This trend has been recognized and represented by the well-known Moore's law relationship. As finFETs reduce in size, the length of the channel decreases, and as the length of the channel decreases, "short-channel effects" can interfere with the finFET's operation and performance. The use of SOI substrates in the fabrication of finFET's may reduce short-channel effects, but can present difficulties for channel strain engineering. For example, it can be difficult to control the amount of source and drain recess for an SOI finFET, and this can significantly impact the effectiveness of subsequently formed straining material (e.g., embedding a strained film in the source/drain regions through selective epitaxial growth) may be difficult.

Some techniques for forming a strained film on and/or in the source/drain regions of a finFET involve etching the fins to reduce the fin height, and selectively forming strain-inducing material on the etched fins. The inventors have recognized that with such techniques, careful control over the etch-back of the fins is desirable, for several reasons. An over-etched fin may lead to insufficient channel strain, because there may not be enough remaining fin to sufficiently impart strain to the channel region, or the fin may be totally removed leaving no seed for subsequent growth of the strain-inducing material. An under-etched fin may lead to insufficient channel strain, because it may not be possible to grow enough strain-inducing material to sufficiently strain the fin and impart that strain to the channel region. Furthermore, lack of uniformity in the etch-back of the fins across a wafer or chip may lead undesirably to widely varying channel strains and performance of finFETs at different locations on the wafer or chip.

To address difficulties associated with etch back of fins, the inventors have conceived of techniques and structures for carefully controlling the etch-back of fins. In some embodiments, the etch-back of fins may be limited by one or more layers formed adjacent the fins. As a result, the heights of the etched-back fins and the strain applied to the finFET channels may be more uniform when this technique is used. In some embodiments, self-limiting techniques for etching back fins may be highly tolerant to variations in the etch rate at different locations on a wafer or chip.

Figure 3:
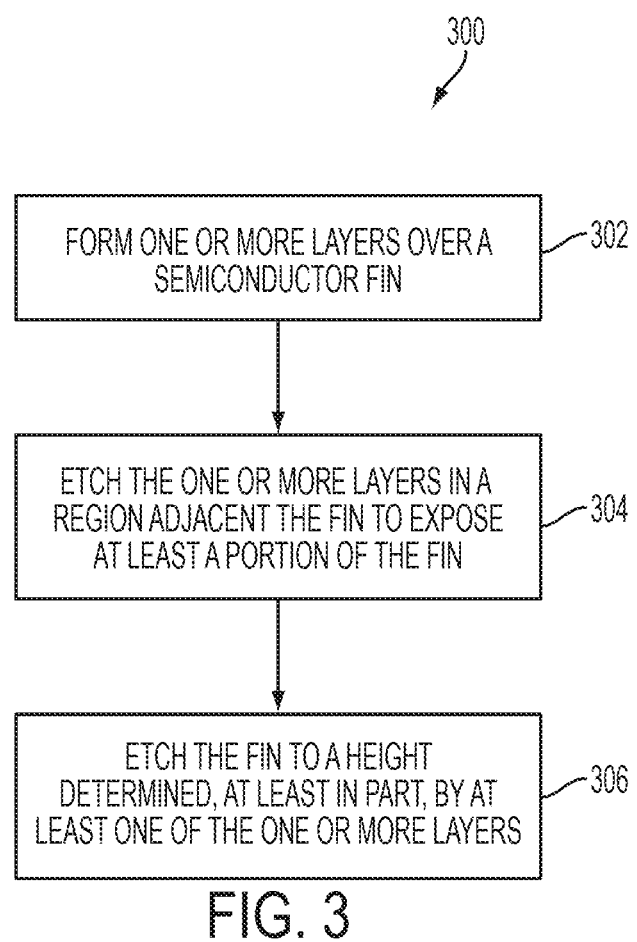
FIG. 3 shows a flowchart of a semiconductor processing method, according to some embodiments.

FIG. 3 shows a flowchart that provides an overview of a semiconductor processing method 300, according to some embodiments. In step 302, one or more layers may be formed over a substrate. At step 304, the one or more layers may be etched at least in regions adjacent to one or more fins. At step 306, the one or more fins may be etched to a height, determined, at least in part, by at least one of the one or more layers. These steps of method 300 are described in further detail below. In some implementations, there may be more or fewer acts than those depicted in FIG. 3. In some embodiments, method 300 may be used to control etch-back of finFET fins during fabrication of a finFET, such as finFET 402 illustrated in FIG. 4.

Figure 4:
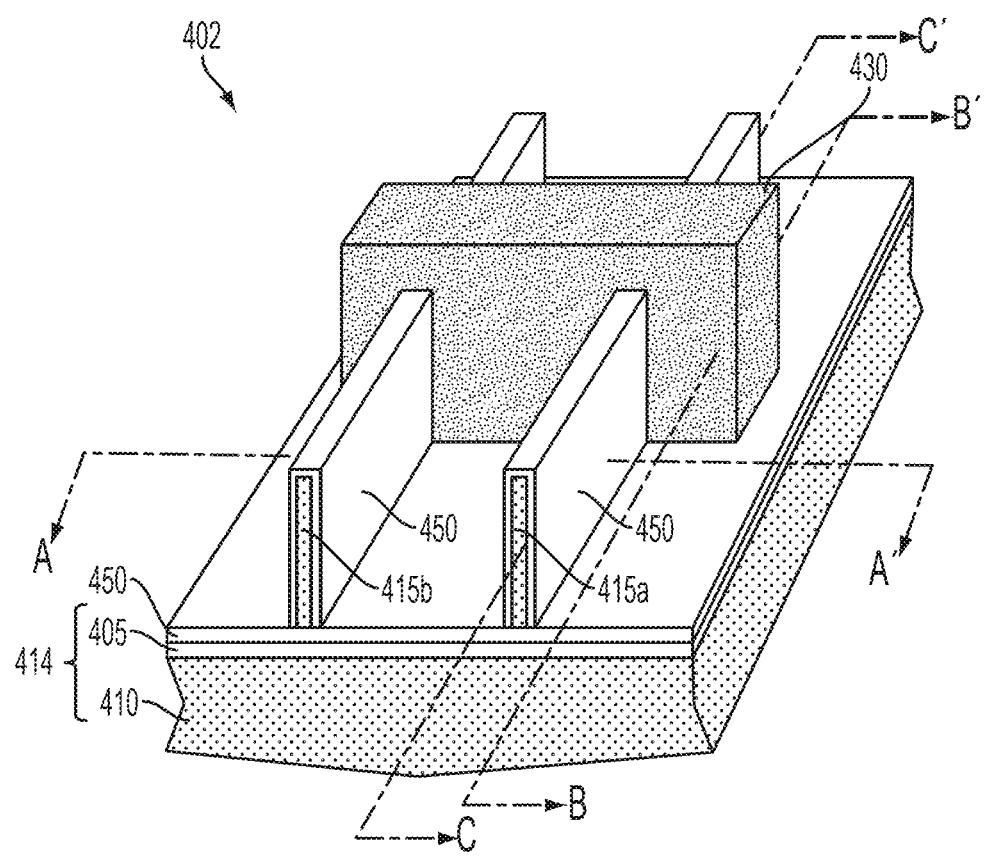
FIG. 4 shows a perspective view of a finFET 402 after a portion of a fabrication process, according to some embodiments.

FIG. 4 shows a cross-sectional view of a finFET 402 at a stage of fabrication prior to performing the acts of semiconductor processing method 300, according to some embodiments. FIGS. 5A, 5B, and 5C show cross-sections of finFET 402 along A-A', B-B', and C-C', respectively, at the same stage of fabrication as illustrated in FIG. 4, according to some embodiments. In some embodiments, FinFET 402 may be formed on an SOI substrate 414 having a substrate layer (e.g., silicon substrate layer) 410 and a buried insulating layer 405 (e.g., buried oxide layer). Buried insulator 405 may include, but is not limited to, one or more layers of silicon oxide and/or any other suitable electrically-insulating material. Although FIG. 4 illustrates an SOI substrate 414, the techniques described herein are not limited to devices formed on SOI substrates, and may be applied to devices formed on bulk substrates (e.g., bulk silicon substrates), and/or any other suitable substrates.

FinFET 402 may include one or more fins 415. The fin(s) may be formed on the substrate by any suitable process (e.g., using sidewall image transfer (SIT) techniques, a mandrel process, lithographically patterning a resist and etching portions of the substrate to form the fin(s), or by patterning and etching trenches and depositing semiconductor material in the trenches to form the fins). In some implementations, lithographic patterning may be done using extreme ultraviolet (EUV) lithography. In some embodiments, the fins (415a, 415b) may have widths between approximately 3 nm and approximately 15 nm, and between approximately 3 nm and approximately 10 nm in some embodiments. In some embodiments, the fins may have heights between approximately 20 nm and approximately 50 nm.

In some embodiments, finFET 402 may include a base layer 450 formed over the substrate. In some embodiments, base layer 450 may be formed over one or more fins 415 and/or over buried insulator 405. In some embodiments, the base layer may be disposed adjacent to and/or on a top surface of a fin. In some embodiments, the base layer may be disposed adjacent to and/or on side surfaces of a fin. In some implementations, the base layer conformally coats the fin, and forms a substantially uniformly-thick layer on exposed surfaces of the fin. In the example of FIG. 4, base layer 450 is disposed adjacent to and on the top and side surfaces of fins 415a and 415b, such that base layer 450 covers fins 415a and 415b, and also covers portions of buried insulator 405.

Base layer 450 may include one or more layers and/or materials (e.g., insulating materials), including, but not limited to, silicon oxide, ethylene-type oxide (e.g., ethylene oxide, ethylene glycol oxide), any other suitable oxide, and/or any other suitable insulating material. In some embodiments, base layer 450 may have a thickness between approximately 2 nm and approximately 4 nm. Base layer 450 may exhibit etch selectivity over the fin material. For example, some embodiments of base layer 450 may be etched with a dry or wet etching process that does not appreciably etch the fin material, so as to remove the base layer and leave the fin. In some embodiments, the base layer 450 forms a gate oxide layer of the gate structure 430.

Base layer 450 may be formed over the substrate by any suitable process that deposits or otherwise forms a layer of suitable material at least over one or more fins. In some embodiments, the base layer may be formed locally on the substrate to cover one or more fins within a selected region of the substrate.

FinFET 402 may include a gate structure 430. The gate structure 430 may at least partially surround at least a portion of the finFET's one or more fins 415 and the base layer 450. In some embodiments, the gate structure may be formed by depositing one or more layers over the substrate, and by using lithographic techniques to pattern a gate structure over the fins. For example, a polysilicon layer may be deposited over the fins, and may be planarized. A hard mask (e.g., a silicon nitride mask) may be deposited and patterned over the polysilicon layer. The hard mask may be patterned using photolithography techniques and etching. The pattern of the hard mask may be transferred to the polysilicon via etching to form the gate structure.

In some embodiments, gate structure 430 may include a gate portion 433, a gate insulator 450, and a spacer structure 480. In some embodiments, gate portion 433 may comprise a gate conductor. A gate conductor may include one or more layers and/or materials (e.g., one or more layers of polysilicon and/or metallic material) configured such that a voltage applied thereto controls a current between the finFET's source and drain. A spacer structure 480 may include one or more layers and/or materials (e.g., one or more nitride layers) disposed at sidewalls of the gate portion adjacent source and drain regions of the finFET. A gate insulator 450 may include one or more layers and/or materials disposed adjacent to the finFET channel and configured to insulate the gate portion from the channel (e.g., one or more layers of silicon oxide, ethylene-type oxide, and/or any other suitable insulating material). Other suitable techniques and materials may be used in other embodiments to form the gate structure.

In some embodiments, gate portion 433 may include a sacrificial gate. A sacrificial gate may include one or more layers and/or materials formed as a "dummy gate" for the finFET 402, and subsequently removed prior to formation of the finFET's final gate structure.

Acts 302-306 of semiconductor processing method 300 are illustrated in FIGS. 6A-12C, which depict various stages in the formation of finFET 402, according to some embodiments. Each of FIGS. 6A-12A depicts a cross-section of finFET 402 along A-A'. Each of FIGS. 6B-12B shows a cross-section of finFET 402 along B-B'. Each of FIGS. 6C-12C depicts a cross-section of finFET 402 along C-C'.

In act 302, according to some embodiments, one or more layers may be formed over the substrate. In some embodiments, the one or more layers formed over the substrate may include a spacer layer 480. In some embodiments, spacer layer 480 may be formed adjacent gate portion 433 and/or adjacent one or more fins 415. In some embodiments, spacer layer 480 may be disposed on one or more exposed surfaces of gate portion 433, and may also be disposed on one or more surfaces of a hard mask 470 at a top surface of the gate structure. The spacer layer may also be disposed at one or more exposed surfaces of a fin and/or on base layer 450 adjacent one or more fins. In some embodiments, spacer layer 480 may conformally cover one or more fins 415 and/or base layer 450 at a substantially uniform thickness. In some embodiments, spacer layer 480 may have a thickness between approximately 5 nm and 15 nm, between approximately 5 nm and approximately 10 nm, or between approximately 6 nm and approximately 9 nm.

In some embodiments, spacer layer 480 may include, but is not limited to, a nitride (e.g., silicon nitride, SiOCN, SiPCN, and/or any other suitable nitride), a boron silicide (SiB), any material suitable for forming a gate spacer structure, and/or any other suitable material.

In some embodiments, portions of spacer layer 480 may be formed adjacent a gate portion 433 of finFET 400, and may function as gate spacers. In some embodiments, portions of spacer layer 480 formed adjacent the finFET's gate portion 433 may have a thickness between approximately 5 and 10 nm. In some embodiments, a layer thickness of 5-10 nm adjacent to the finFET's gate structure may facilitate proper formation of the finFET source and drain regions. For example, a spacer layer 480 thickness of 5-10 nm may be used to carefully locate source and drain junctions, and subsequently used for gate conductor replacement.

FIGS. 6A-6C illustrate cross-sections of finFET 402 after formation of spacer layer 480, according to some embodiments. In the example of FIG. 6A, spacer layer 480 is formed adjacent to top and side surfaces of fins 415$a$ and 415$b$, such that spacer layer 480 covers the fins and the portions of base layer 450 formed on the fins. In the example of FIGS. 6B-6C, spacer layer 480 is formed adjacent to side and top surfaces of gate portion 433 and hard mask 470, such that spacer layer 480 covers gate portion 433 and hard mask 470. Though, in some embodiments, hard mask 470 may be removed before spacer layer 480 is formed. In addition, in the example of FIGS. 6A-6C, spacer layer 480 is formed on base layer 450 over buried insulator 405 at least in regions adjacent to the fins 415 and/or the gate structure 430.

In some embodiments, the one or more layers formed over the substrate in act 302 may include a second layer 485. The second layer 485 may exhibit etch selectivity over the spacer layer 480. In some embodiments, second layer 485 may be formed on spacer layer 480. In some embodiments, portions of second layer 485 may be formed adjacent a top surface and/or one or more side surfaces of a fin 415. In some embodiments, portions of second layer may be formed adjacent a top surface and/or one or more side surfaces of gate structure 430. In some embodiments, second layer 485 may be a planarizing layer that covers fins 415, portions of regions adjacent the fins 415, and all or some of the gate structure 430.

In some embodiments, second layer 485 may comprise an organic planarization layer (OPL). The OPL may comprise polyimide, polymethyl methacrylate, polymethylisopropenyl ketone, photoresists, or any suitable polymer. In some embodiments, the OPL may comprise a spin-on glass. In some embodiments, the second layer 485 may comprise a developable organic planarization layer (developable OPL).

In some embodiments, the developable OPL may include a light-sensitive material which, when exposed to radiation (e.g., electromagnetic radiation), is chemically altered such that a layer at the exposed surface of the developable organic PL may be removed using a developing solvent. The light-sensitive material may comprise polyacrylate resin, epoxy resin, phenol resin, polyamide resin, polyimide resin, unsaturated polyester resin, polyphenylenether resin, polyphenylenesulfide resin, benzocyclobutene (BCB), and/or any organic polymer and a photo-active compound having a molecular structure that can attach to the molecular structure of the organic polymer.

In some embodiments, second layer 485 may comprise one or more materials having a thickness which can be accurately and uniformly reduced by a timed etch process. The one or more materials may include, but are not limited to organic planarization layer (OPL) and/or organic development layer (ODL).

In some embodiments, second layer 485 may be planarized. Second layer 485 may be planarized using any suitable planarization technique, including, but not limited to, chemical-mechanical polishing. After planarization, the top surface of second layer 485 may be substantially flat. In some embodiments, the thickness of second layer 485 may be between approximately 100 nm and 2 μm. The thickness of the second layer 485 may be predetermined with high accuracy. In some embodiments, the thickness of the second layer 485 may be measured after planarization, e.g., by ellipsometry.

FIGS. 7A-7C illustrate cross-sections of finFET 402 after formation of second layer 485, according to some embodiments. In the example of FIGS. 7A-7C, second layer 485 is formed over spacer layer 480 in at least regions where the fins 415 and the gate structures 430 are located. In the example of FIGS. 7A-7C, second layer 485 is planarized.

While an embodiment has been described in which the one or more layers formed in act 302 of method 300 include a spacer layer 480 and a second layer 485, some embodiments are not limited to formation of spacer layer 480 and second layer 485. In some embodiments, the number of layers formed in act 302 may be one, three, or more than three.

In act 304, according to some embodiments, one or more layers may be etched in a region adjacent a fin. In some embodiments, the one or more etched layers may include second layer 485, which may be etched using a first etch process. The first etch process may be anisotropic. Though, in some embodiments, the first etch process may be isotropic.

In some embodiments, the first etch process may include, but is not limited to, a timed etch process, and/or any other suitable type of etch process. In a timed etch process, the extent (e.g., depth) to which a layer is etched may be controlled approximately based on the etch time and the etch rate. The etch rate of second layer 485 during the first etch process may be approximately uniform across the wafer and/or chip. In some embodiments, the first etch process may be controlled such that, at the completion of the first etch process, a top surface of second layer 485 is below a top surface of a fin 415 in a region adjacent the fin (e.g., a height of second layer 485 above the substrate may be less than a height of a fin above the substrate, at least in a region adjacent to the fin). By knowing the thickness of the second layer 485, and timing the etch correctly, a selected amount of the fin 415 (and base layer and spacer layer covering the fin) can be exposed above the second layer 485, as depicted in FIG. 8A.

In some embodiments, the first etch process may etch second layer 485 without etching spacer layer 480 or with negligible etching of spacer layer 480. For example, during the first etch process, exposed surfaces of second layer 485 may be etched at a higher rate than exposed surfaces of spacer layer 480 (e.g., the etch rate of second layer 485 during the first etch process may be at least 3, 5, 10, 20, 50, or 100 times higher than the etch rate of spacer layer 480). Thus, portions of spacer layer 480 may remain above the second layer 485 after the first etch process. The different etch rates for the first and second layers may be determined by the characteristics of the first and second layers (e.g., materials, geometry), and/or by characteristics of the first etch process.

In some embodiments, the first etch process may be performed during a processing sequence for patterning the spacer layer 480 (e.g., gate spacer patterning). Thus, in some embodiments, the first etch process may not add any additional masking steps to the finFET fabrication process. In some implementations, the first etch adds a timing requirement to an etch to reveal the gate structure during a gate spacer patterning process.

FIGS. 8A-8C illustrate cross-sections of finFET 402 after etching second layer 485, according to some embodiments. In the example of FIGS. 8A-8C, second layer 485 has been etched to a depth below the top surfaces of fins 415a and 415b, such that the top surface of second layer 485 is below the top surfaces of the fins in regions adjacent to the fins. In some embodiments, the second layer 485 is etched back to reveal approximately one-half of the fin height. For example, the surface of the second layer 485 is etched back to a level approximately halfway between the top and bottom of the fin. Because the etching of the second layer can be carefully controlled, the revealed height of the fin can be controlled to within about ±5 nm in some embodiments, and to within about ±2 nm in some embodiments. Since the second layer is planarized before the etch, the amount of fin revealed is uniform across the substrate to within ±10 nm in some embodiments, and within ±5 nm in some embodiments.

In some embodiments, the one or more layers etched in act 304 may further include spacer layer 480, which may be etched using a second etch process. The second etch process may be anisotropic. Though, in some embodiments, the second etch process may be isotropic. In some implementations, the second etch process may be mostly anisotropic, but include some isotropic etching.

In some embodiments, the second etch process may etch spacer layer 480 without etching (or with negligible etching of) second layer 485, base layer 450, and/or fins 415. For example, during the second etch process, exposed surfaces of spacer layer 480 may be etched at a higher rate than exposed surfaces of second layer 485, base layer 450, and/or fins 415 (e.g., the etch rate of spacer layer 480 may be at least 3, 5, 10, 20, 50, or 100 times higher than the etch rates of second layer 485, base layer 450, and/or fins 415. The different etch rates for the first layer and the other layers and/or structures may be determined by characteristics (e.g., materials, geometry) of the layers and/or structures, and/or by characteristics of the second etch process.

In some embodiments, the second etch process may comprise, but is not limited to, a self-limiting etch process. In a self-limiting etch process, the extent (e.g., depth) to which at least some portions of an etched layer are etched may be determined, at least in part, by characteristics of layers and/or structures adjacent the etched layer (e.g., by the presence and/or etch rate of a fin structure, gate structure, and/or layer above and/or adjacent to the etched layer), and/or by the width of an exposed surface of the etched layer. In some embodiments, etching may not occur, may be negligible, or may occur slowly when the width of an exposed surface of the etched layer is less than a threshold width.

In some embodiments, the second etch process may be self-limited, at least in part, by second layer 485. Thus, the height of the etched spacer layer 480 may be determined, at least in part, by a thinness of the spacer layer 480 and presence of second layer 485 and base layer 450 adjacent to the spacer layer. The exposed spacer layer 480 may be etched back to a level substantially co-planar with a top surface of second layer 485, according to some embodiments. Because of the thinness of the spacer layer 480 and presence of adjacent layers which do not appreciably etch, the spacer layer etching may self limit at approximately the surface of the second layer 485. When this surface is reached, the etch rate of the spacer layer 480 may reduce significantly, e.g., by a factor of two or more.

In some embodiments, the second etch process may additionally etch spacer layer 480 in a region adjacent to gate structure 430 to form gate spacers. The forming of the gate spacers may be done simultaneously with etch back of the spacer layer 480 at the fins. Thus, in some embodiments, a same etch processing step may be applied to form the gate spacers and to etch back spacer layer 480 in a region adjacent to a fin 415.

FIGS. 9A-9C illustrate cross-sections of finFET 402 after etching spacer layer 480, according to some embodiments. In the example of FIG. 9A, spacer layer 480 is etched to approximately the surface of second layer 485 in the regions adjacent fins 415a and 415b, such that the surface of spacer layer 480 is substantially co-planar with the surface of second layer 485 (e.g., the height of spacer layer 480 is within approximately ±2 nm of the height of second layer 485 in some embodiments, and within approximately ±1 nm of the height of second layer 485 in some embodiments) in the regions adjacent the fins. Thus, in the example of FIGS. 9A and 9C, the etch-back of spacer layer 480 removes spacer layer 480 from the top of fin 415 and from the upper portions of the sides of fin 415. The etch-back of spacer layer 480 may be self-limited to approximately the surface of second layer 485 near the fins because the width of the exposed surface of spacer layer 480 near the fins may be quite small (e.g., between approximately 5 nm and 15 nm, or between approximately 5 nm and 10 nm) making it difficult for the etchant to reach the portions of spacer layer 480 below the surface of second layer 485, and because the layers adjacent to the exposed surface of spacer layer 480 (e.g., second layer 485 and base layer 450) may have low etch rates during the second etch process. In some embodiments, the etch to remove the spacer layer may be isotropic, so that exposed regions of the spacer layer etch more quickly than narrow regions sandwiched between layers having low etch rates.

In some embodiments, after etching spacer layer 480, a third etch process may or may not be performed to etch second layer 485. In some embodiments, the third etch process may result in the removal of second layer 485 from the wafer or chip. The third etch process may include any suitable etch technique, including, but not limited to, the same etch technique used in the first etch process, a timed etch technique, a self-limited etch technique, and/or any other suitable etch technique. In some embodiments, the third etch process may remove second layer 485 without etching base layer 450 (or with negligible etching of base layer 450). In some embodiments, the third etch process may also remove exposed regions base layer 450, and the etching of base layer 450 may be self-limited. In some embodiments, the third etch process may be anisotropic. Though, in some embodiments, the second etch process may be isotropic.

In some embodiments, after etching spacer layer 480, the remaining portions of second layer 485 may remain on the wafer or chip at least until the etch-back of the fins 415 is performed.

FIGS. 10A-10C illustrate cross-sections of finFET 402 after removal of second layer 485, according to some embodiments. In the example of FIGS. 10A-10C, portions of spacer layer 480 remain in regions adjacent gate structure 430 (e.g., as gate spacers) and in regions adjacent to the sides of fins 415.

In act 306, according to some embodiments, one or more fins may be etched to a height determined, at least in part, by one or more of the layers formed in act 302. The fins 415 may be etched back using any suitable etch technique, including, but not limited to, anisotropic etching and/or isotropic etching. In some embodiments, isotropic etching of the fins may result in enhanced channel strain and/or result in the source/drain regions of the finFET being positioned closer to the channel region, because isotropic etching may remove some portions of fin 415 located below the gate spacers in a region adjacent to the finFET channel.

In some embodiments, a fin etch process may etch one or more fins 415 and the portions of base layer 450 covering the fins 415 without etching spacer layer 480 and/or second layer 485 (or with negligible etching of spacer layer 480 and/or second layer 485). For example, during the fin etch process, exposed surfaces of fin 415 and base layer 450 may be etched at a higher rate than exposed surfaces of spacer layer 480 and/or second layer 485 (e.g., the etch rate of the fins 415 and/or base layer 450 may be at least 3, 5, 10, 20, 50, or 100 times higher than the etch rates of spacer layer 480 and/or second layer 485). The different etch rates for the respective layers and structures may be determined by characteristics (e.g., geometry, materials) of the layers and/or structures, and/or by characteristics of the fin etch process.

In some embodiments, the fin etch process may include, but is not limited to, at least one self-limiting etch process, and/or any other suitable type of etch process. According to some embodiments, the fin etch process may comprise two self-limiting etches. A first self-limiting etch may be used to etch back the base layer 450 to a height of approximately the spacer layer 480 at the sides of the fins. In some embodiments, the base layer etch process may be self-limited, at least in part, by a thinness of the base layer and the presence of the spacer layer 480 and/or the second layer 485. Thus, the height of the etched base layer 450 may be determined, at least in part, by spacer layer 480 and/or second layer 485 (e.g., the top surface of base layer 450 may be substantially co-planar with a top surface of spacer layer 480 and/or a top surface of second layer 485) adjacent to a fin 415, as depicted in FIG. 11A.

A second self-limiting etch may then be used to etch back the fin to a height of approximately the spacer layer 480 at the sides of the fins. In some embodiments, the fin etch process may be self-limited, at least in part, by a thinness of the fin and the presence of the spacer layer 480 and/or second layer 485. Thus, the height of the etched fin 415 may be determined, at least in part, by spacer layer 480 and/or second layer 485 (e.g., the top surface of the etched fin 415 may be substantially co-planar with a top surface of spacer layer 480 and/or a top surface of second layer 485) adjacent to a fin 415, as depicted in FIG. 11A.

According to some embodiments, the fin etch process may comprise a single self-limiting etch, in which both the base layer 450 and the fin 415 are etched back to a height of approximately the space layer 480 at the sides of the fins. In some embodiments, the combined etch process may be self-limited, at least in part, by a thinness of the base layer and fin together, and by the presence of the spacer layer 480 and/or the second layer 485. Thus, the height of the etched base layer 450 and the fin 415 may be determined, at least in part, by spacer layer 480 and/or second layer 485 (e.g., the top surface of base layer 450 and the top surface of fin 415 may be substantially co-planar with a top surface of spacer layer 480 and/or a top surface of second layer 485) adjacent to a fin 415, as depicted in FIG. 11A.

In some implementations, the self-limiting etches may result in an etched layer height that is below a height of adjacent layers. For example, the etched fin 415 may self-limit to a height that is a few nanometers (e.g., approximately 1 to 5 nanometers) below the upper surface of the spacer layer 480. Accordingly, the height of the spacer layer may be increased to account for the difference in etch heights between the etched layer and non-etched layers.

FIGS. 11A-11C illustrate cross-sections of finFET 402 after etching one or more fins 415, according to some embodiments. In the example of FIGS. 11A and 11C, base layer 450 and fins 415 are etched to approximately the surface of spacer layer 480 in the regions adjacent the sides of the fins. The top surfaces of the fins (and the top portions of base layer 450 adjacent the sides of the fins) may be substantially co-planar with the top edges of spacer layer 480 adjacent the sides of the fins (e.g., the height of the fins 415 and base layer 450 may be within approximately 1-2 nm of the top edges of the spacer layer 480). In some embodiments, the height of the etched fins 415 may be between approximately 20 nm and 50 nm.

The etch-back of the fins 415 (and the portions of base layer 450 adjacent to the sides of the fins) may be self-limited to approximately the top edges of spacer layer 480 adjacent the fins, (1) because the width of the opening formed by the base layer 450 (between the spacer layer 480 and the fin 415) may be quite small (e.g., approximately 2 nm-4 nm), making it difficult for the etchant to reach portions of base layer 450, and because the layers adjacent to the top surface of the base layer 450 may have low etch rates during the base layer etch process, (2) because the width of the opening formed by the fin 415 (between portions of the spacer layer 480 and portions of the base layer 450 adjacent to the sides of the fin) may be quite small (e.g., approximately 3 nm-10 nm), making it difficult for the etchant to reach portions of fin 415, and because the layers adjacent to the top surface of the fin 415 may have low etch rates during the fin etch process, and/or (3) because the width of the opening formed by the base layer 450 and the fin 415 together (between portions of spacer layer 480 adjacent to the sides of the fin) may be small (e.g., approximately 7 nm-18 nm), making it difficult for the etchant to reach portions of base layer 450 and fin 415, and because the layers adjacent to the top surfaces of fin 415 and base layer 450 may have low etch rates during the combined etch process.

As can be seen in FIG. 11C, some portions 416 of the fins 415 covered by gate structure 430 and/or the gate spacers may be etched during etch back of the fins. In some embodiments, an isotropic etch process may be used in addition to an anisotropic etch to increase the amount of portions 416 removed.

In some embodiments, after etching one or more fins 415, an optional etch process may be performed to etch portions of spacer layer 480. In some embodiments, this optional etch process may result in the removal of spacer layer 480 from regions adjacent the fins 415. In some embodiments, this optional etch process may not result in the removal of the gate spacers. This optional etch process may include any suitable etching technique, including, but not limited to, the same etch technique used in the second etch process, a timed etch technique, and/or any other suitable etch technique. In some embodiments, the optional etch process may be anisotropic. In some embodiments, the optional etch process may not be performed, and portions of spacer layer 480 may remain in regions adjacent to the fins 415 at the end of the finFET fabrication process.

In some embodiments, method 300 may include an act (not illustrated in FIG. 3) of inducing strain in the finFET channel. The channel strain may be induced using any suitable technique, including, but not limited to, selectively forming (e.g., growing or depositing) strain-inducing material in and/or on the exposed portions of the fins 415. In some embodiments, a material (e.g., SiGe) may be formed under compressive stress at the source and/or drain regions of a finFET using an epitaxial growth process, thereby inducing strain in the finFET's channel. In some embodiments, a material (e.g., SiN and/or SiC) may be formed under tensile stress at the source and/or drain regions of an finFET using an epitaxial growth process, thereby inducing an opposite strain in the finFET's channel. Accordingly, appropriate channel strains may be induced for p-channel and n-channel devices of CMOS integrated circuits.

FIGS. 12A-12C illustrate cross-sections of finFET 402 after growing strain-inducing materials (490a, 490b) at source and drain regions of the fins 415. According to some embodiments, a material 490a, 490b formed under compressive stress on the source and drain regions imparts compressive strain to the channel region of the finFET. In some embodiments, a material 490a, 490b formed under tensile stress on the source and drain regions imparts tensile strain to the channel region of the finFET. Imparting opposite strains on a same substrate may be done by masking a first portion of the fins during a first epitaxial growth of strain-inducing material at a second portion of the fins, and masking the second portion of the fins during a second epitaxial growth of strain-inducing material at the first portion of the fins.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments. Additional acts of a method not illustrated in FIG. 3 may include, but are not limited to, doping the drain/source regions of the device (e.g., by ion implantation), replacing a sacrificial gate with a gate conductor, and/or any other suitable act.

Although embodiments of the techniques described herein have been described as conferring particular benefits, some embodiments of the techniques described herein may confer only one, fewer than all, or none of the described benefits.

Although embodiments of the techniques described herein have been described in relation to finFETs with strained source/drain regions, the techniques described herein are not limited in this regard. The techniques described herein may be applied, for example, to any finFET fabrication process wherein precise control of the etch-back of the fins is desired.

As used herein, an act of "forming" a layer may include any suitable process that deposits, grows, coats, transfers, or otherwise forms a layer of material on a wafer or die, including, but not limited to, epitaxy, physical vapor deposition (PVD), chemical vapor deposition (CVD), electrochemical deposition (ECD), molecular beam epitaxy (MBE), sputtering, e-beam evaporation, and/or atomic layer deposition (ALD). In some embodiments, forming a layer may comprise additive processes (processes which add material to the wafer or die), modification processes (processes which modify properties of material on the wafer or die), and/or removal processes (processes which remove material from the wafer or die, e.g., etching).

As used herein, an act of "etching" a material or a layer may include any suitable process that removes material from a wafer or die, including, but not limited to, wet etching, dry etching, plasma etching, isotropic etching, anisotropic etching, timed etching, and/or self-limited etching. In some etch processes, a portion of the wafer is protected from the etchant by a masking material ("mask") which resists the etching, including, but not limited to a patterned photoresist or hard mask.

As used herein, "strained source/drain" may refer to a source region and/or a drain region that is compressively or tensiley strained, e.g., by the formation of a strain-inducing material at the source/drain region.

As used herein, "recessed source/drain" may refer to a source region and/or a drain region formed, at least in part, by recessing (e.g., etching) a structure, including, without limitation, a fin. In some embodiments, the process of recessing the structure (e.g., fin) that forms at least a portion of the source region and/or drain region may leave one or more indicia of the structure's recessed nature on the remaining portion of the recessed structure or elsewhere on the semiconductor device.

As used herein, the "top" of a fin may refer to a surface of the fin that is farthest from the substrate surface over which the fin is formed. In some embodiments, the top of the fin may be approximately parallel to the substrate surface over which the fin is formed.

In some embodiments, the techniques described herein may be used to form semiconductor devices as components in integrated circuits. In some embodiments, CMOS devices may be formed by applying the above-described technique (e.g., method 300) during formation of n-channel finFETs and during formation of p-channel finFETs.

According to an aspect of the present disclosure, a semiconductor processing method is provided, comprising: conformally depositing a first layer over a fin configured to form a portion of a finFET; depositing a second layer to cover the fin and the first layer; etching the second layer to expose the first layer in a region adjacent the fin; and etching the first layer in the region adjacent the fin to approximately a surface of the second layer.

Although the drawings depict one or a few transistor structures, it will be appreciated that a large number of transistors can be fabricated in parallel following the described semiconductor manufacturing processes. The transistors may be incorporated as part of microprocessing or memory circuitry for digital or analog signal processing devices. The transistors may be incorporated in logic circuitry, in some implementations. The transistors may be used in consumer electronic devices such as smart phones, computers, televisions, sensors, microprocessors, microcontrollers, field-programmable gate arrays, digital signal processors, application specific integrated circuits, logic chips, analog chips, and digital signal processing chips.

Although some of the foregoing methods and structures are described in connection with "finFETs," the methods and structures may be employed for variations of finFET devices in some embodiments. For example, according to some implementations, the methods and structures may be employed for the fabrication of tri-gate, pi-gate, or omegagate transistors. In some embodiments, the methods and structures may be employed for the fabrication of gate-all-around (GAA) transistors.

The terms "approximately," "substantially," and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately," "substantially," and "about" may include the target dimension.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for forming fins of a finFET, the method comprising:
    forming one or more spacer layers over a fin including a semiconductor fin having a first height;
    forming a planarized layer over the one or more spacer layers, the planarized layer being etch selective relating to the spacer layers;
    recessing the planarized layer to a level between a bottom of the semiconductor fin and a top of the semiconductor fin;
    etching the one or more spacer layers in a region adjacent the fin to expose at least a portion of the fin above a second height that is less than the first height, said etching of the one or more spacer layers being self-limited at the second height by the level of the recessed planarized layer;
    removing the recessed planarized layer; and
    etching the exposed portion of the fin to remove a portion of the semiconductor fin to a height determined, at least in part, by a top surface of the previously etched at least one of the one or more spacer layers at the second height.

2. The method of claim 1, wherein the etching of the exposed portion of the fin is self-limited by at least a level of the top surface of the previously etched at least one of the one or more spacer layers and by a width of an opening defined by the fin.

3. The method of claim 2, wherein the width of the semiconductor fin is between approximately 3 nm and approximately 10 nm.

4. The method of claim 1, wherein etching of the exposed portion of the fin comprises etching the exposed portion of the fin to approximately said top surface of the previously etched at least one of the one or more spacer layers.

5. The method of claim 1, wherein recessing the planarized layer comprises:
    performing a timed etch of the planarized layer to etch back a top surface of the planarized layer to said level between the bottom of the semiconductor fin and the top of the semiconductor fin.

6. The method of claim 1, further comprising forming the one or more spacer layers covering first layer as a spacer layer at the fin and covering a gate conductor for the fin.

7. The method of claim 6, wherein the one or more spacer layers comprise a nitride layer and wherein etching the one or more spacer layers further comprises etching the nitride layer at the gate conductor to form gate spacers.

8. The method of claim 1, wherein forming the one or more spacer layers comprises:
    conformally depositing a spacer layer over the fin to a thickness between approximately 5 nm and approximately 10 nm.

9. The method of claim 8, further comprising forming a gate spacer layer for a gate structure of the finFET in a same deposition step in which the spacer layer is deposited over the fin.

10. The method of claim 1, wherein etching the exposed portion of the fin comprises etching the semiconductor fin at source and drain regions of the finFET, and further comprising growing strain-inducing material on the semiconductor fin at the source and drain regions.

11. The method of claim 10, wherein a lattice parameter of the strain-inducing material differs from a lattice parameter of the semiconductor fin.

12. The method of claim 10, wherein the strain-inducing material imparts a strain in a channel of the finFET.

13. The method of claim 10, wherein the semiconductor fin is formed from bulk silicon and the strain-inducing material comprises one of silicon germanium and silicon carbide.

14. The method of claim 1, wherein the method further comprises forming a conformal insulating layer on the semiconductor fin prior to forming said one or more spacer layers, and wherein etching the one or more spacer layers comprises etching the conformal insulating layer to expose said portion of the semiconductor fin.

15. The method of claim 14, wherein the conformal insulating layer forms a gate insulator for the finFET.

16. The method of claim 1, wherein the planarized layer comprises an organic planarization layer.

17. A method for forming a finFET, comprising:
    forming a fin structure including a semiconductor fin formed from a semiconductor layer of a silicon on insulator substrate, wherein the fin structure has a first fin height;
    forming a gate structure over a channel region of the fin structure;
    forming a spacer layer over the gate structure and the fin structure;
    forming a planarized layer over the spacer layer, the planarized layer being etch selective relative to the spacer layer;
    recessing the planarized layer to a top surface at a level between a bottom of the fin structure and a top of the fin structure;
    etching the spacer layer to expose an upper portion of the fin structure, said etching of the spacer layer using the top surface of the recessed planarizing layer to self-limit the etching of the spacer layer to stop at a level approximately at a top surface of the spacer layer adjacent to the fin structure;
    removing the planarizing layer;
    etching the semiconductor fin of the fin structure to reduce the fin structure to a second fin height, the second fin height being less than the first fin height, so that sides of a lower portion of the fin structure remain covered by the etched spacer layer, said etching of the semiconductor fin using said etched spacer layer to self-limit the etching of the fin structure to stop at a level approximately at the top surface of the spacer layer;

wherein a channel region of the fin structure remains at the first fin height under the gate structure; and epitaxially growing a source region and a drain region on exposed surfaces of the etched semiconductor fin adjacent the channel region.

18. The method of claim 17, further comprising depositing an oxide layer over the semiconductor fin; and wherein forming the spacer layer comprises depositing the spacer layer over the oxide layer.

19. The method of claim 17, wherein a lattice parameter of the epitaxially grown source region and drain region differs from a lattice parameter of the semiconductor fin.

20. The method of claim 17, wherein the epitaxially grown source region and drain region impart a strain on the channel region.

21. The method of claim 17, wherein etching the spacer layer forms a spacer on side walls of the gate structure.

\* \* \* \* \*